United States Patent [19]

Page et al.

[11] Patent Number: 5,269,878
[45] Date of Patent: Dec. 14, 1993

[54] METAL PATTERNING WITH DECHLORINIZATION IN INTEGRATED CIRCUIT MANUFACTURE

[75] Inventors: Allen Page; Stacy W. Hall, both of San Antonio, Tex.

[73] Assignee: VLSI Technology, Inc., San Jose, Calif.

[21] Appl. No.: 990,329

[22] Filed: Dec. 10, 1992

[51] Int. Cl.$^5$ ............... C23F 1/00; C23F 15/00
[52] U.S. Cl. .................... 156/640; 156/643; 156/646; 156/656; 156/664; 134/2; 134/31; 134/33
[58] Field of Search ............ 156/646, 643, 656, 664, 156/640; 134/1, 2, 31, 33

[56] References Cited

U.S. PATENT DOCUMENTS 4,749,440  6/1988  Blackwood et al. ............... 156/646
5,000,819  3/1991  Pedder et al. ...................... 156/643
5,078,832  1/1992  Tanaka ........................... 156/640 X
5,105,556  4/1992  Kurokawa et al. ............... 134/11 X
5,200,025  4/1993  Toei et al. ........................ 156/640

FOREIGN PATENT DOCUMENTS 62-43152  2/1987  Japan .

Primary Examiner—Thi Dang
Attorney, Agent, or Firm—Clifton L. Anderson

[57] ABSTRACT

After a metal deposition is patterned using a plasma etch, the metal pattern is sprayed with steam and water. During the spraying the wafer is rotated to ensure proper distribution and removal of the spray. The spray removes chlorine residue from the etch that might otherwise corrode the metal pattern. After the spray, the spin rate is increased to dry the wafer. The net result is a faster and more effective method for chlorine removal from a plasma-etched metal pattern.

6 Claims, 3 Drawing Sheets

METAL PATTERNING WITH DECHLORINIZATION IN INTEGRATED CIRCUIT MANUFACTURE

BACKGROUND OF THE INVENTION

The present invention relates to the manufacturing of integrated circuits and, more particularly, to a method of patterning a metal layer of an integrated circuit so as to minimize corrosion due to chlorine introduced during a plasma etch of the metal layer.

After individual devices are defined in an integrated circuit, they must be interconnected. Typically, the devices are defined in a semiconductor substrate. The devices are then covered with a dielectric material, such as silicon oxide or an organic glass. Apertures are formed in the dielectric to provide access to the devices. A metal is deposited over the dielectric; during deposition, the apertures through the dielectric are filled with metal, such as copper or aluminum, defining electrical connections between the devices and a metal layer.

Patterning of the metal typically proceeds by coating the metal with photoresist. The photoresist is then exposed to patterned light, thereby defining soluble areas and insoluble areas of the photoresist. The photoresist is then developed by using solvent to remove the soluble areas of the photoresist so as to expose underlying metal areas. The exposed metal areas are etched away, while the metal pattern protected by unremoved photoresist remains intact. The remaining photoresist is then removed, exposing the metal pattern. Additional levels of interconnects can be added by repeating the procedure: the metal pattern is covered by a dielectric; via apertures are formed through the dielectric; the next metal layer is deposited and patterned.

There are several alternative methods of etching the exposed metal areas. Those skilled in the art are aware of the various considerations involved in selecting one etching method over another. In many cases, plasma etches can provide precise low-temperature etches and that are often the approach of choice.

One problem with a plasma etch is that it can leave reactive residues that can corrode the metal pattern. Sidewalls of the metal pattern are exposed after etching, and these sidewalls can be attacked by reactive residues. For example, some plasmas include chlorine or a chlorine-bearing compound. Chlorine residue on the wafer can interact with moisture to create hydrochloric acid that attacks exposed copper and/or aluminum sidewalls of the metal pattern. The corrosion can impair the performance of an integrated circuit, and in more extreme cases, can render the integrated circuit inoperable.

The corrosive action of the chlorine can be significant if left in place for a minute or more. Accordingly, efforts have been made to remove the chlorine immediately after the etch. A typical chlorine removal procedure involves placing the wafer on a hot plate and baking the wafer. The baking can be performed under a nitrogen or other moisture-free blanket to prevent hydrochloric acid from forming. This can be followed by a rinse with room temperature water. The rinse can be effected by flooding a vessel containing the wafer or by submerging the wafer in a water bath. Finally, the wafer can be dried by heating or spinning.

Variations of this method include rinsing without baking or baking without rinsing and drying. Alternative methods include using a polymer deposition as a protective layer and using a chemical rinse to react with or dissolve the chlorine preemptively. With all these methods, there are concerns about effectiveness of the chlorine removal and the time required for the chlorine removal. The time required affects wafer throughput, and thus the economics of integrated circuit manufacture. What is needed is a faster and more effective method of removing chlorine and/or other reactive residues from a metalized integrated circuit wafer.

SUMMARY OF THE INVENTION

In accordance with the present invention, a metal pattern defined by a chlorine-bearing plasma is sprayed with steam and then dried. Areas of a deposited metal layer are selectively protected using photoresist. The unprotected metal is then etched using a chlorine-bearing plasma. After the remaining protective photoresist is removed, the exposed metal pattern is sprayed with steam. The spray can be steam alone, or steam mixed with water, for example, in the form of a mist.

Preferably, the wafer is spun about an axis orthogonal to the wafer and metal pattern and the spray is applied along this axis. A spin rate of 50–1000 revolutions per minute (rpm) can be used to ensure the spray and any resulting condensate is distributed over the metalized wafer surface. Once spraying is halted, the spin rate can be increased to 2000–5000 rpm to effect drying.

One advantage of this method is that, in effect, a heating step and a rinsing step are performed together. In addition, drying is effected simply by increasing the rotation rate after the spray has ended. Chlorine removal is rapid and relatively complete. The wafer does not have to be transported during the chlorine removal procedure. Furthermore, the steam or mist of the steam and water used to remove chlorine are inexpensive and benign.

In contrast to prior art methods using polymer or chemical agents, the present invention does not require special materials for chlorine removal. There is no need to move a wafer from a hot plate to a rinse bath to a spin dryer. These and other features and advantages of the present invention are apparent from the description below with reference to the following drawings.

DESCRIPTION OF THE PREFERRED EMBODIMENTS

Figure 1:
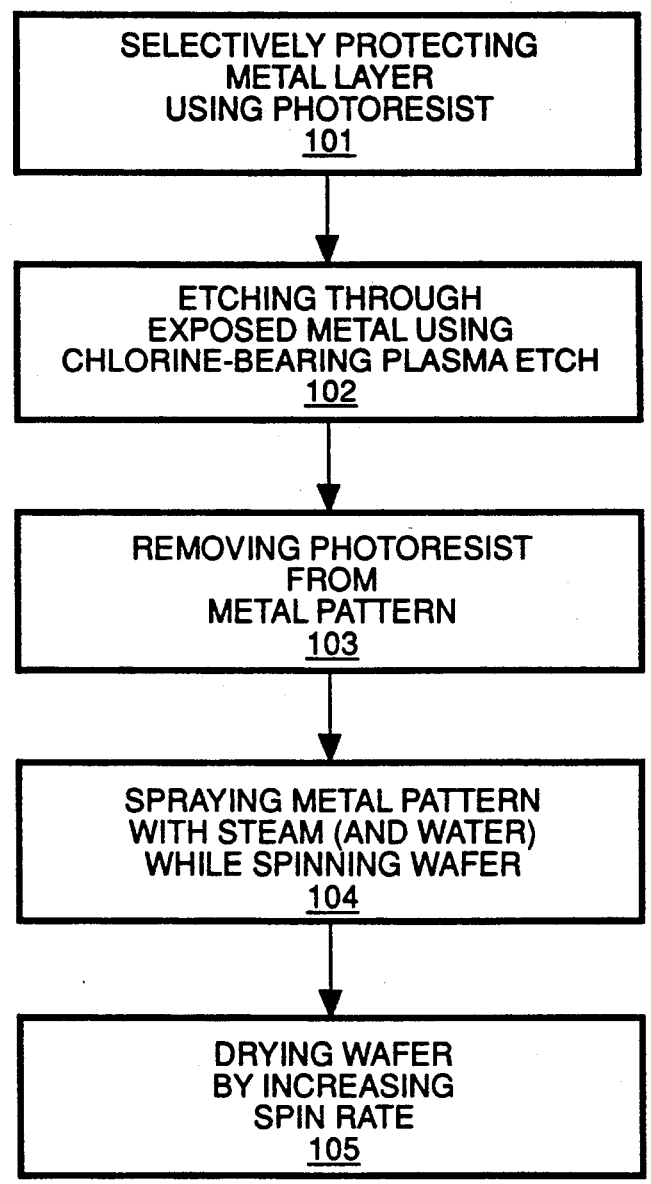
FIG. 1 is a flow chart of a method in accordance with the present invention.

In accordance with the present invention, a method 100 for patterning a metal layer of an integrated circuit wafer comprises the steps of: at step 101, selectively protecting the metal layer using photoresist; at step 102, etching through exposed metal using a chlorine-bearing plasma etch; at step 103, removing photoresist from the remaining metal pattern; at step 104, spraying the metal pattern with steam or mist of steam and water while spinning the wafer; and, at step 105, drying the wafer by increasing the spin rate. These steps are indicated in the flow chart of FIG. 1.

Figure 2:
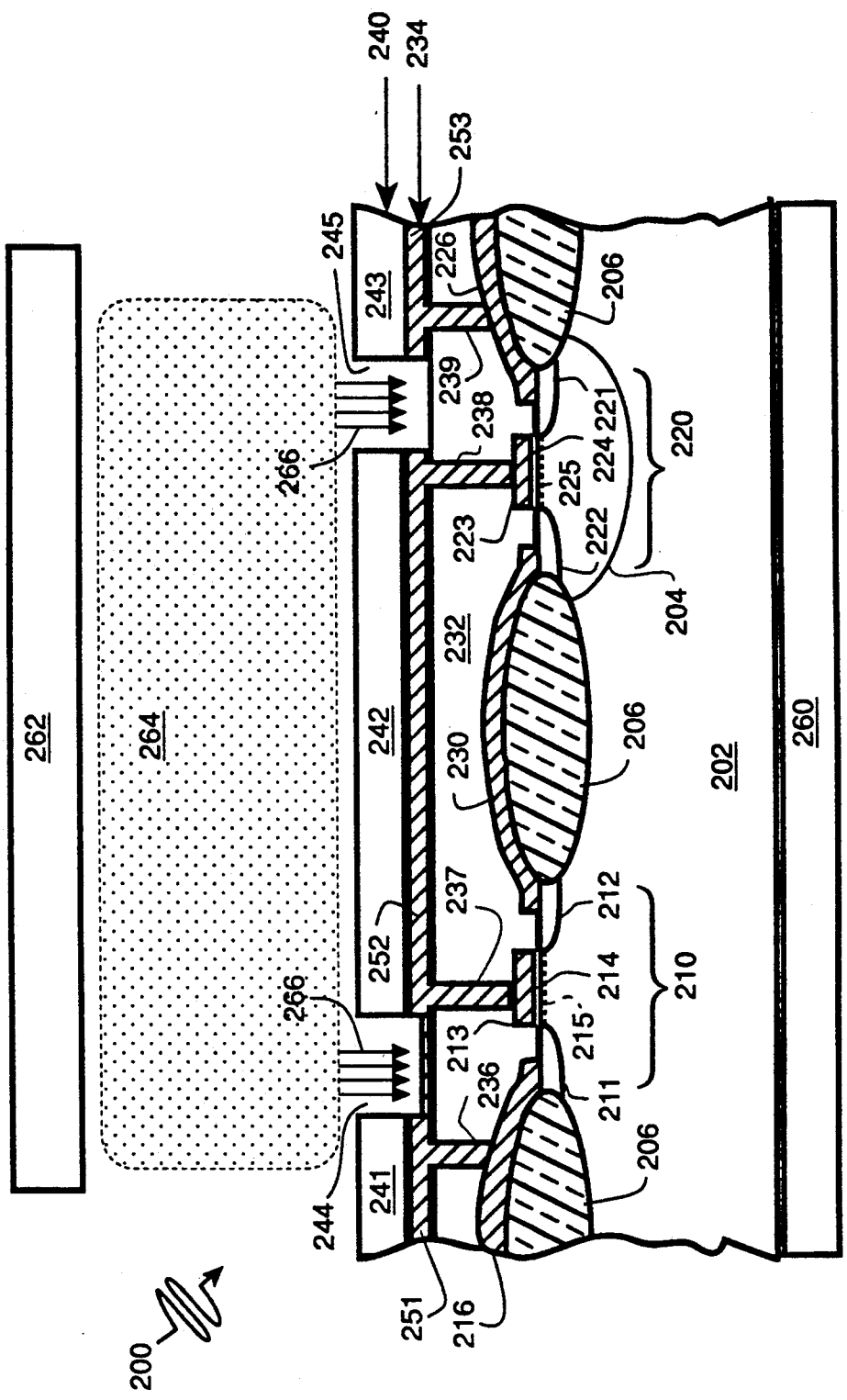
FIG. 2 is a sectional view of an integrated circuit wafer during an etching step of the method of FIG. 1.

The context for method 100 is illustrated in FIG. 2. The manufacture of an integrated circuit wafer 200, shown in progress, began with the formation of an NMOS transistor 210 and a PMOS transistor 220 in a p-type silicon substrate 202. PMOS transistor 220 is fabricated in an n-wall 204 in substrate 202. Transistors 210 and 220 are isolated from each other and from other devices in integrated circuit 200 by a field oxide 206.

NMOS transistor 210 comprises a source 211, a drain 212, a gate 213 and a gate oxide 214 over a channel region 215 between source 211 and drain 212. PMOS transistor 220 includes a source 221, a drain 222, a gate 223, and a gate oxide 224 over a channel region 225. Polysilicon source contacts 216 and 226 provide electrical access to NMOS source 211 and PMOS source 221 respectively. A polysilicon bridge 230 electrical couples NMOS drain 212 and PMOS drain 222 in an inverter configuration.

The transistor components just described are covered by an organic glass dielectric layer 232, which provides a planar surface for further processing. Apertures are formed in dielectric layer 232 to provide access to integrated circuit devices including transistors 210 and 220. Metal is deposited on organic glass dielectric layer 232 forming a metal layer 234. During deposition, metal fills the dielectric apertures forming conductive vias 236, 237, 238 and 239 which physically and electrically contact with source contacts 216 and 226 and to gates 213 and 223 as shown. Metal layer 234 includes three sublayers (not separately shown), including a lower titanium-tungsten adhesive sublayer, a copper-/aluminum bulk conductor sublayer, and an upper titanium-tungsten adhesive sublayer.

A photoresist is spun onto deposited metal layer 234 to form a photoresist layer 240. Photoresist layer 240 is exposed to patterned light; the resulting photochemical conversion causes photoresist layer 240 to be divided into soluble regions (vacated in FIG. 2) and insoluble regions 241, 242, and 243. Photoresist layer 240 is then developed by applying a solvent to remove the soluble regions, defining photoresist apertures 244 and 245, through which portions of metal layer 234 are exposed. The unremoved photoresist regions 241, 242 and 243 cover respective metal regions 251, 252, and 253.

Wafer 200 with patterned photoresist is placed in a plasma reaction chamber on a base electrode 260 and below a remote electrode 262. The chamber is evacuated to a low pressure. A radio frequency potential is applied between electrodes 260 and 262 as reactant gas is introduced into the chamber. The gas includes diatomic chlorine; alternatively, the gas can include a chlorine-bearing compound such as boron tetrachloride.

The radio frequency field between electrodes 260 and 262 ionizes the reactant gas to form plasma 264. Some plasma particles, indicated by arrows 266, strike wafer 200. Particles strike exposed metal and remove it, while metal covered by photoresist remains protected. In FIG. 2, metal exposed by photoresist aperture 244 is shown partially removed at an earlier time in the etch process, while metal exposed by photoresist aperture 245 is shown entirely removed at the end of the plasma etch. Once the plasma etch is completed, the remaining photoresist, including portions 241, 242, and 243, is removed. This leaves the desired metal pattern 250 exposed; metal pattern 250 is constituted in part by metal areas 251, 252, 253, 254 and 255, as indicated in FIG. 3.

With the metal patterned, each of the metal regions 251, 252, 253, 254 and 255 has freshly exposed sidewalls adjacent to regions where plasma has etched away metal. The intermediate copper/aluminum bulk conductor sublayer is exposed to chlorine residue left by the plasma etch. It is the sidewalls of this intermediate sublayer that is most susceptible to corrosion by hydrochloric acid. The following steps are directed to removing the chlorine residue to minimize acid formation and corrosion.

Figure 3:
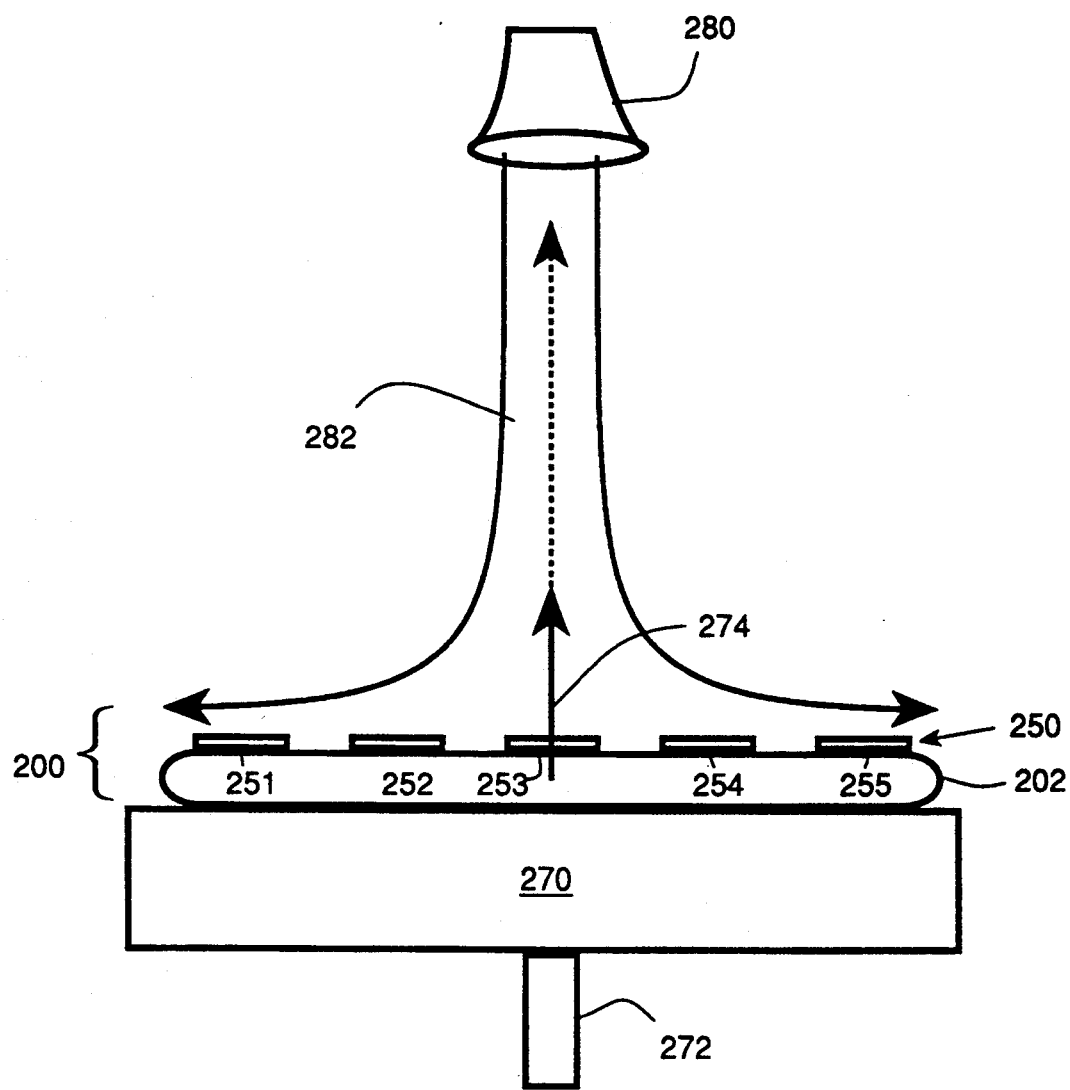
FIG. 3 is a sectional view of the integrated circuit of FIG. 2 during a steam spraying step and a drying step of the method of FIG. 1.

Wafer 200 with metal pattern 250 is placed on a platter 270, as shown in FIG. 3. Platter 270 has a motor driven shaft 272, so that platter 270 and wafer 200 can be rotated at selectable rates. Wafer 200 is placed with its center aligned with the axis of rotation. Initially, wafer 200 is rotated at 500 rpm as a mixture of steam and water is sprayed onto metal pattern 250 and wafer 200. The initial rotation rate is represented by axial spin arrow 274. The direction of spin is determined by the right hand rule of physics so that the rotation is counter-clockwise when viewed from above.

A spray head 280 directs the steam/water spray, indicated by arrows 282, axially toward wafer 200. Initially, the spray trajectory is orthogonal to wafer 200 and metal pattern 250. However, due to pressure differentials and centrifugal force induced by spinning, the spray is urged radially outward, as indicated by arrows 282. The heat from the sprayed steam and corresponding hot water encourages outgasing of chlorine residue, while the radial spray motion serves as a rinse for the outgases. This spraying and spinning is continued for 4 minutes.

When the spraying is completed, the rotation rate is increased to 2500 rpm for 30 seconds. This is sufficient to remove any remaining water, including condensate, so that wafer 200 and metal pattern 250 are dried.

Many parameters can be varied according to circumstances. For example, during spraying, rotation rates of 50 rpm to 1000 rpm can be utilized. During drying, rotation rates of 2000 to 5000 rpm can be used with good results. The time of the spraying and drying operations can be varied, provided that each is long enough to maintain efficacy. The composition of the spray can be varied from 100% steam to 99% liquid by volume.

The present invention provides for variations to the foregoing embodiments. The spraying and drying can be performed without spinning. The wafer need not be centered on a spinning axis. For example, a single platter can be used to rotate a group of wafers, none of which is on axis. The present invention may be applied with combination to other methods, for example, a hot plate may be used to bake the wafer following the spraying. These and other modifications to and variations upon the preferred embodiments are provided for by the present invention, the scope of which is limited only by the following claims.

We claim:

1. In the manufacture of an integrated circuit, a method for patterning a metal layer previously deposited on a wafer, said method comprising steps of:

selectively protecting areas of a metal layer using photoresist;

etching through the unprotected portions of said metal using a chlorine-bearing plasma to define a metal pattern;

removing the photoresist over said metal pattern;

spraying said metal pattern with steam; and drying said wafer;

whereby, corrosion of said metal pattern by chlorine is minimized.

2. A method as recited in claim 1 wherein:
during said spraying step, said wafer is spun about an axis orthogonal to said metal pattern.

3. A method as recited in claim 2 wherein said wafer is spun at different speeds during said drying step and said spraying step.

4. A method as recited in claim 3 wherein:
during said spraying step, said wafer is spun at a speed between 50 rpm and 1000 rpm.

5. A method as recited in claim 4 wherein:
during said drying step, said wafer is spun at a speed between 2000 rpm and 5000 rpm.

6. A method as recited in claim 1 wherein:
during said spraying step, said wafer is sprayed with a mixture of water and said steam.

* * * * *